United States Patent
Heinz et al.

(10) Patent No.: US 8,201,753 B2
(45) Date of Patent: Jun. 19, 2012

(54) ACTUATOR MODULE WITH A SHEATHED PIEZOELECTRIC ACTUATOR

(75) Inventors: Rudolf Heinz, Renningen (DE); Dieter Kienzler, Leonberg (DE); Udo Schaich, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 284 days.

(21) Appl. No.: 12/305,753

(22) PCT Filed: Sep. 13, 2007

(86) PCT No.: PCT/EP2007/059613
§ 371 (c)(1),
(2), (4) Date: Dec. 19, 2008

(87) PCT Pub. No.: WO2008/043636
PCT Pub. Date: Apr. 17, 2008

(65) Prior Publication Data
US 2010/0163650 A1 Jul. 1, 2010

(30) Foreign Application Priority Data
Oct. 9, 2006 (DE) .......................... 10 2006 047 606

(51) Int. Cl.
*B05B 1/08* (2006.01)
*B05B 3/04* (2006.01)
*F02M 61/10* (2006.01)
*H01L 41/00* (2006.01)

(52) U.S. Cl. ............... 239/102.2; 239/102.1; 239/533.2; 239/533.11; 310/311; 310/328; 310/340

(58) Field of Classification Search .............. 239/102.1, 239/102.2, 533.2, 533.3, 533.11; 310/311, 310/328, 340
See application file for complete search history.

(56) References Cited

U.S. PATENT DOCUMENTS

| 4,943,004 A * | 7/1990 | Takahashi ....................... 239/95 |
| 5,004,945 A * | 4/1991 | Tomita et al. .................. 310/328 |
| 5,113,108 A * | 5/1992 | Yamashita et al. ............ 310/328 |
| 6,998,761 B1 * | 2/2006 | Frank et al. .................... 310/328 |
| 7,339,308 B2 * | 3/2008 | Boecking et al. ............. 310/348 |
| 2003/0107301 A1 * | 6/2003 | Asano et al. ................... 310/328 |
| 2006/0087202 A1 | 4/2006 | Flaemig-Vetter et al. |

FOREIGN PATENT DOCUMENTS

| DE | 19914411 A1 | 10/2000 |
| DE | 10048430 A1 | 4/2002 |
| DE | 10054017 A1 | 5/2002 |
| DE | 10257445 A1 | 7/2003 |
| JP | 2125674 A | 5/1990 |
| WO | 2004006348 A2 | 1/2004 |

* cited by examiner

*Primary Examiner* — Len Tran
*Assistant Examiner* — Ryan Reis
(74) *Attorney, Agent, or Firm* — Ronald E. Greigg

(57) ABSTRACT

An actuator module including a piezoactuator, for example for a piezoinjector for metering fuel in an internal combustion engine, is proposed. The piezoactuator has piezoelements stacked one above another between an actuator head and an actuator foot and is provided with at least one elastomer layer enclosing the piezoelements. The elastomer layer is enveloped by a corrugated bellows or by telescopic tubes, composed of a material that is diffusion-impermeable with respect to a fuel to be metered by the piezoinjector. The corrugated bellows or the telescopic tubes have on their periphery grooves which can absorb expansions of the elastomer layer or of the piezoactuator.

18 Claims, 3 Drawing Sheets

Section A-A

ACTUATOR MODULE WITH A SHEATHED PIEZOELECTRIC ACTUATOR

CROSS-REFERENCE TO RELATED APPLICATION

This application is a 35 USC 371 application of PCT/EP 2007/059613 filed on Sep. 13, 2007.

BACKGROUND OF THE INVENTION

1. Field of the Invention

The invention relates to an actuator module with a piezoelectric actuator having a sheath, which can be used for instance in a piezoelectric injector for chronologically and quantitatively precise metering o fuel in an internal combustion engine.

2. Description of the Prior Art

One such piezoelectric injector essentially comprises a holder body and the piezoelectric actuator disposed in the holder body; the piezoelectric actuator has elements, stacked one above the other between an actuator head and an actuator foot, and each of the elements have piezoelectric layers enclosed by inner electrodes. The elements are constructed, using a material with a suitable crystalline structure (piezoelectric ceramic) for the piezoelectric layers, in such a way that upon application of an external voltage to the inner electrodes, a mechanical reaction of the elements ensues, which as a function of the crystalline structure and the regions of contact with the electrical voltage represents a compression or tension in a predeterminable direction. In a piezoelectric injector, the piezoelectric actuator is connected to a nozzle needle, so that by application of a voltage to the elements, a nozzle opening is uncovered.

In diesel piezoelectric injectors, in so-called direct nozzle needle control, the piezoelectric actuators operate directly in the diesel fuel at high pressure. For protecting the elements, for example with a view to insulating them electrically, it is known to sheathe the piezoelectric actuator with a diesel-proof elastomer. A disadvantage of this is that elastomers used for the purpose are not diffusion-proof to diesel fuel, water, and other media in the fuel.

From German Patent Disclosure DE 101 39 871 A1, a piezoelectric injector with an actuator module, acting on a valve member via a hydraulic pressure booster, is known in which the elements of the piezoelectric actuator are disposed in a sleeve provided with a corrugated bellows.

ADVANTAGES AND SUMMARY OF THE INVENTION

The invention is based on an actuator module, described at the outset, with a piezoelectric actuator which has elements, disposed between an actuator head and an actuator foot, and a fluid-tight sheath, surrounding at least the elements, of the piezoelectric actuator. According to the invention, an sheath lying over an elastomer layer advantageously, at least in some regions, has grooves formed by undulations or has telescoping tubes, with which by their orientation on the circumference of the sheath, radial and/or axial expansion motions of the piezoelectric actuator and/or of the elastomer layer can be absorbed.

In addition to the requisite diffusion-proof sheathing of the piezoelectric actuator, the refinement according to the invention of the actuator module is advantageous in particular because the elastomer layer, lying beneath the sheath, can expand unhindered upon heating, without mechanically destroying the sheath from the internal pressure that occurs, for instance from cracks. Moreover, air bubbles and voids in the elastomer layer can be compacted by means of the invention without tearing of the sheath.

In a first embodiment of the invention, the actuator module is provided with a corrugated bellows as the sheath; the corrugated bellows advantageously has the grooves, formed by undulations, in some regions on its circumference, with which grooves, by their orientation with the circumference of the sheath, radial and/or axial expansion motions of the piezoelectric actuator and/or of the elastomer layer can be absorbed. This is not attainable with the corrugated bellows known from the prior art, since that corrugated bellows remains radially rigid.

In a second embodiment of the actuator module of the invention, the sheath is formed of telescoping tubes guided inside one another, of which preferably at least one has the grooves formed by undulations on its circumference in some regions, with which grooves, by their orientation with the circumference of the sheath, radial and/or axial expansion motions of the piezoelectric actuator and/or of the elastomer layer can be absorbed.

In this last proposed embodiment, the interstices between the telescoping tubes, joined one inside the other, can also be filled with elastomer, and as a result, advantageously, the diffusion length of the surrounding fluid is lengthened, and the diffusion area is reduced, in comparison with the elastomer layer lying on the piezoelectric actuator.

If smooth telescoping tubes are used as sheaths here, then compensation takes place of axial expansion between the telescoping tubes filled with elastomer; because of the relatively narrow gap between the telescoping tubes, the elastomer is subjected to strong shear stress, but it is almost impossible to compensate for radial expansion, for instance upon thermal expansion. With the advantageous disposition of grooves in accordance with the invention, compensation for both radial and axial expansion is thus made substantially easier.

The proposed grooves can advantageously also be axially extending longitudinal grooves, which then facilitate an axial thermal expansion of the piezoelectric actuator without the risk of damage to the sheath. On the other hand, the proposed longitudinal grooves may instead be radially extending transverse grooves, which absorb radial expansion of the piezoelectric actuator, thereby reducing the thrust stresses in the elastomer. However, the grooves can also be embodied as single- or multi-thread and clockwise and/or counterclockwise grooves extending at a predetermined angle to the longitudinal or transverse axis of the piezoelectric actuator, or a combination of all the embodiments of grooves proposed can be provided.

Particularly from the axial component of the orientation of the grooves, it can thus be assured in a simple way that the internal pressure of the elastomer layer can decrease upon a thermal expansion and will not damage the actuator module or the sheath. If there are remaining air bubbles or other remaining voids between the elastomer layer and the sheath, the longitudinal grooves can easily yield radially and compress the air, again without damaging the rest of the sheath.

The threadlike or helical grooves can be provided particularly to facilitate production, since they are easy to produce using a rolling tool. To preclude torsional motions, both a clockwise and counterclockwise helical groove region may advantageously be provided.

The grooves or various combinations of the grooves can be disposed for instance in the middle region of the sheath or in regions on at least one lateral end in the longitudinal extent, or over the entire circumference. The arrangements of longitudinal grooves or helical or orthogonal transverse grooves can be distributed, to suit the demand of the longitudinal or transverse expansion to be absorbed, over the circumference in the longitudinal extent of the corrugated bellows, or of a telescoping or other kind of sheath, and the lengths and angles in the helical circumferential groove can also be varied and combined, for instance within a range from 0° to 45°.

The sheath as a corrugated bellows or as a telescope in the actuator module of the invention can preferably be produced from a metal material such as steel. The corrugated bellows or the telescoping tubes can be welded in a simple way to the actuator head and/or foot, as a rule also of steel, of the piezoelectric actuator.

A preferred application of the actuator module of the invention is obtained if, as already mentioned in the background section, the piezoelectric actuator is a component of a piezoelectric injector for an injection system for fuel in an internal combustion engine, in which the fuel bathes the sheath.

BRIEF DESCRIPTION OF THE DRAWINGS

The invention will be described below in conjunction with drawings. In the drawings.

DESCRIPTION OF THE PREFERRED EMBODIMENTS

Figure 1:
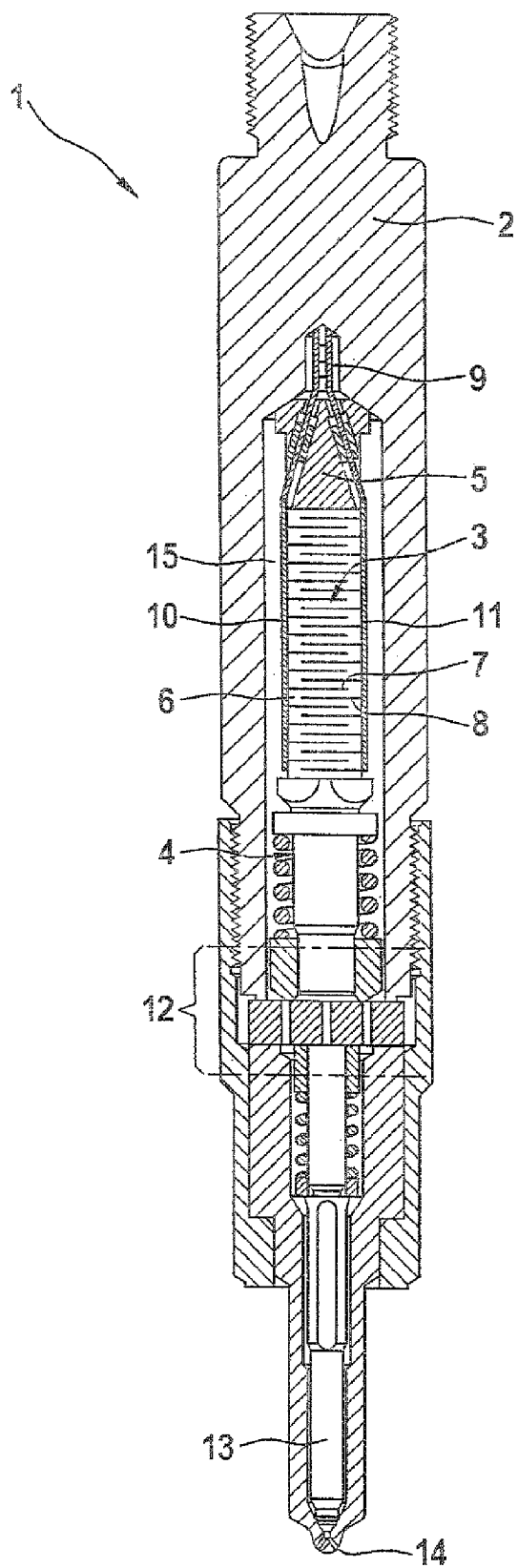
FIG. 1 is a schematic illustration of a piezoelectric injector with an actuator module of the prior art in longitudinal section.

A piezoelectric injector 1 in accordance with the prior art, shown in FIG. 1 to explain the actuator module of the invention, essentially includes a holder body 2 and a piezoelectric actuator 3, which is located in the holder body 2 and has an actuator head 4 and an actuator foot 5. Between the actuator head 4 and the actuator foot 5, there is a plurality of elements 6, stacked one above the other, which each comprise piezoelectric layers of piezoelectric ceramic and inner electrodes 7 and 8 enclosing the piezoelectric ceramic.

The inner electrodes 7 and 8 of the elements 6 are contacted electrically via a plug part 9 with lead lines to outer electrodes 10 and 11. The piezoelectric actuator 3, which with other components, not shown in detail here, represents a so-called actuator module, is connected to a nozzle needle 13 via a coupler 12. By application of a voltage to the elements 6 via the inner electrodes 7 and 8 and by the resultant mechanical reaction, a nozzle opening 14 is uncovered, as explained in the background section. The actuator module with the piezoelectric actuator 3, in the application shown in FIG. 1 as a piezoelectric injector, is bathed by the fuel to be metered, in a chamber 15.

Figure 2:
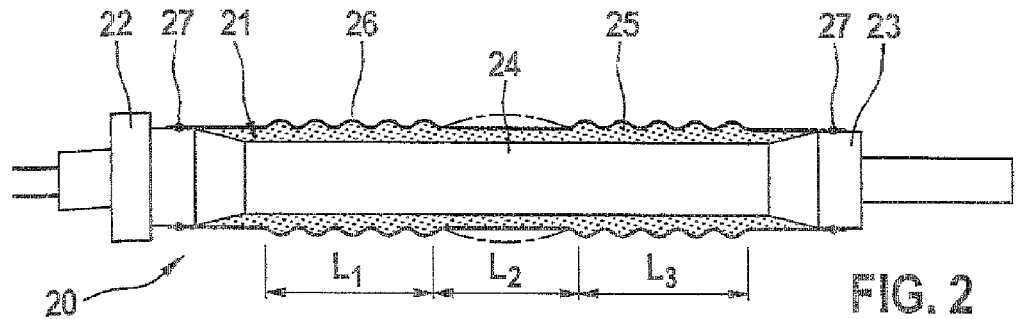
FIG. 2 is a schematic illustration of an actuator module of the invention, having a corrugated bellows, as a first exemplary embodiment of a sheath of a piezoelectric actuator in the actuator module with an expandable sheath.

In FIG. 2, an actuator module 20 according to the invention is shown, with a piezoelectric actuator 21 that is surrounded here, from the actuator head 22 to the actuator foot 23, including the elements 24, by an electrically insulating elastomer layer 25. Around the elastomer layer 25 is a metal corrugated bellows 26, as a fluid-tight sheath. The corrugated bellows 26 is joined at both ends to the actuator head 22 and the actuator foot 23, by a welded connection 27 in each case. The corrugated bellows 26 serves both to seal the elements 24 off in a diffusion-tight manner from plastic surrounding a piezoelectric injector and to absorb thermal and mechanical longitudinal expansions of the piezoelectric actuator 21 elastically without generating major longitudinal force and without absorbing thermal or otherwise-caused changes in volume of the elastomer layer 25.

Since when used in a piezoelectric injector, the relatively high fuel pressure prevails at the corrugated bellows 26 on all sides, and the corrugated bellows 26 for space reasons is relatively thin, the elastomer layer 25 need not fill the interior between the piezoelectric actuator 21 and the corrugated bellows 26 completely. As a result, the corrugated bellows 26 comes under pressure on all sides, without additional tensile or compressive stresses. In FIG. 2, regions $L_1$ and $L_3$ of the corrugated bellows 26 can be seen, and there is a middle region $L_2$, which is intended here to absorb radial expansions.

Figure 3:
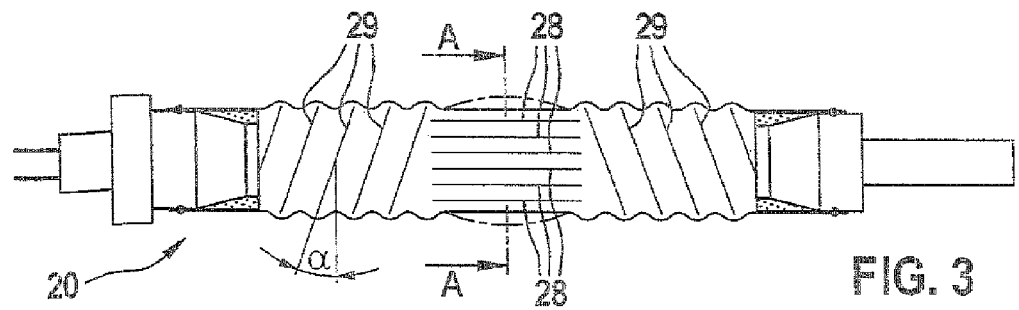
FIG. 3 is an illustration of an actuator module in longitudinal section through FIG. 2, with a corrugated bellows with longitudinal grooves in a central radially elastic zone.

To facilitate radial thermal expansion of the elastomer layer 25 substantially, without generating radial tensile stress in the corrugated bellows 26, longitudinal grooves 28 are disposed in a middle region in the exemplary embodiment of FIG. 3. In the lateral regions of the corrugated bellows 26, instead of the radial circumferential grooves of the corrugated bellows 26 as in FIG. 2, in FIG. 3 threaded or helical circumferential grooves 29 are provided, with a pitch angle α to the radial circumferential groove. To facilitate torsional motions without putting a load on the elements 24, different clockwise or counterclockwise helical circumferential grooves 29 are disposed on the two sides of the longitudinal grooves 28.

Figure 4:
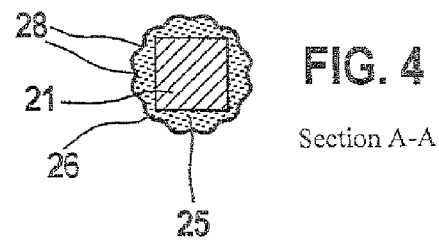
FIG. 4 is a cross section through the actuator module of FIG. 3 along the section line A-A.

FIG. 4 shows a section through the actuator module 20 of FIG. 3 along the section line A-A; here, both the longitudinal grooves 28 and the corrugated bellows 26 and the elastomer layer 25 surrounding the piezoelectric actuator 21 can be seen.

Figure 5:
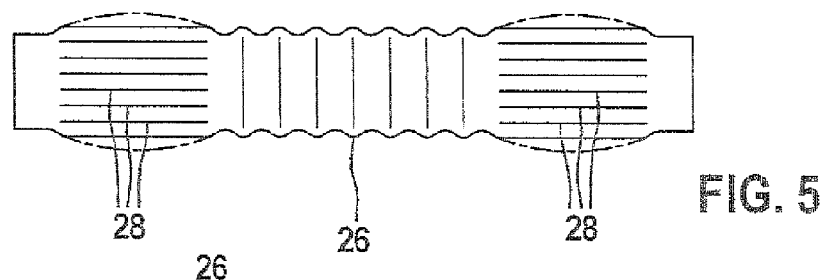
FIG. 5 is a view of a corrugated bellows with longitudinal grooves in the side regions.

In FIG. 5, an embodiment of the invention can be seen, in which the longitudinal grooves 28 are disposed on both sides of a middle region of the corrugated bellows 26.

Figure 6:
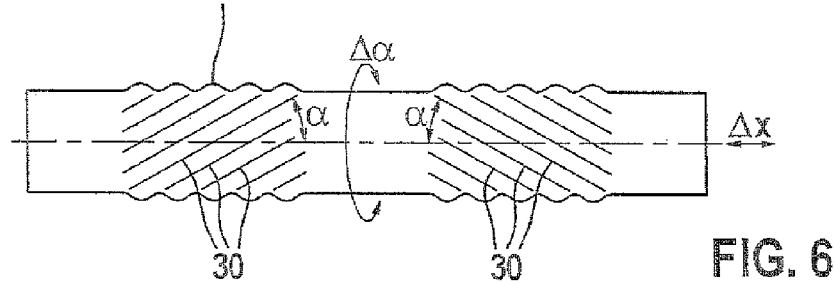
FIG. 6 is a view of a corrugated bellows with helical transverse grooves.

FIG. 6 shows different clockwise or counterclockwise helical circumferential grooves 30 disposed on both lateral regions of the sheath on the corrugated bellows 26, which here have a pitch angle α to the longitudinal axis of the piezoelectric actuator. In FIG. 6, the incident stroke Δx of the piezoelectric actuator is also shown, which leads to a torsion Δα between the lateral regions and the different clockwise or counterclockwise helical circumferential grooves 30. By optimizing the pitch angle α and the number of circumferential grooves 30, the torsion Δα can be minimized, so that the rigidity in the x-direction (stroke direction of the piezoelectric actuator) remains low.

Figure 7:
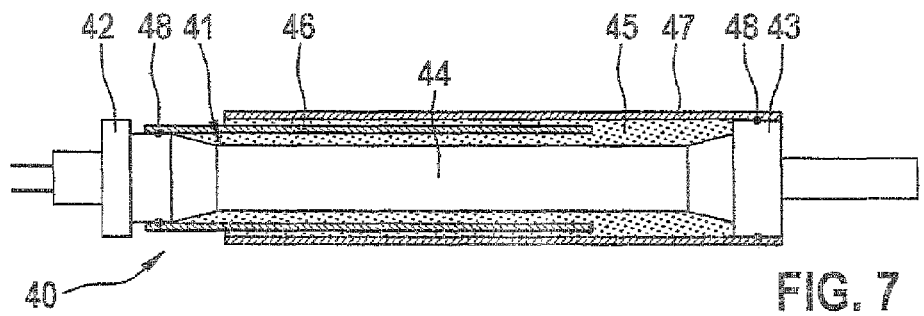
FIG. 7 is a schematic illustration of an actuator module of the invention with telescoping tubes, as a second exemplary embodiment of a sheath of the piezoelectric actuator.

A second exemplary embodiment of the invention is shown in FIG. 7, with an actuator module 40 having a piezoelectric actuator 41, which here is again surrounded by an electrically insulating elastomer layer 45, from the actuator head 42 to the actuator foot 43, including the elements 44. As a fluid-tight sheath around the elastomer layer 45, here there are an inner telescoping tube 46 and outer telescoping tube 47. The inner telescoping tube 46 is welded to the actuator head 42 and the outer telescoping tube 47 is welded to the actuator foot 43, in each case by means of a weld connection 48.

In the exemplary embodiment of FIG. 7, the interstices between the telescoping tubes 46 and 47 can also be filled with the aforementioned elastomer of the elastomer layer 45; because of the relatively narrow gap, upon mechanical longitudinal expansion, these elastomer regions are subjected to strong shear stress. It is almost impossible to compensate for radial expansion, for instance upon thermal expansion of the elastomer layer 45; only thrust expansion between the two telescoping tubes 46 and 47 is possible.

Figure 8:
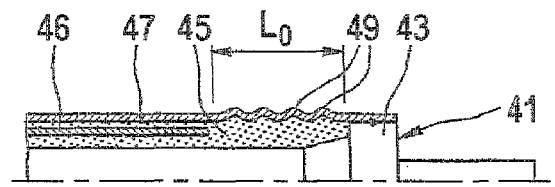
FIG. 8 is a view of an actuator module with transverse grooves on the order of a corrugated bellows in a lateral, axially elastic zone of a telescoping tube.

In FIG. 8, an embodiment for improving the arrangement of FIG. 7 is shown, in which, to avoid the great axial expansion of the elastomer layer 45 between the two telescoping tubes 46 and 47, a region $L_0$ with transverse grooves 49 extending all the way around the circumference of the outer telescoping tube 47 is provided. The length of the region $L_0$ is adaptable to the required conditions for expansion compensation.

Figure 9:
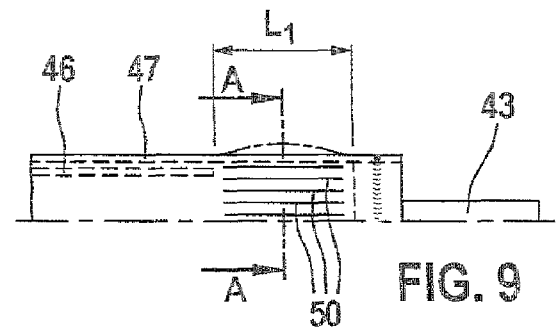
FIG. 9 is a view of an actuator module with longitudinal grooves in a lateral, radially elastic zone, in this case of an outer telescoping tube.
Figure 10:
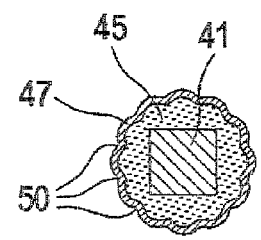
FIG. 10 is a section through the actuator module of FIG. 9 along the section line A-A.

In an embodiment of FIG. 9, longitudinal grooves 50 are provided in a lateral region, in a region $L_1$ on the outer telescoping tube 47, and these can compensate especially well for the radial thermal expansion of the elastomer layer 45 in particular. From FIG. 10, a section can be seen through the actuator module of FIG. 9 along the section line A-A in the region of the outer telescoping tube 47 having the longitudinal grooves 50.

Figure 11:
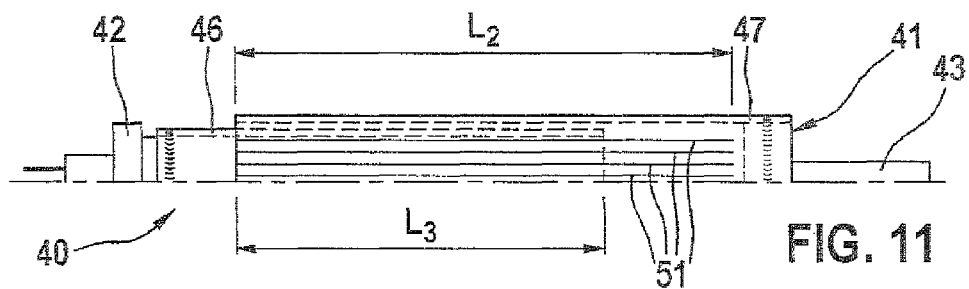
FIG. 11 is an illustration of an actuator module with longitudinal grooves on both the inner and the outer telescoping tube, over virtually the entire length.

FIG. 11 shows a view of the actuator module 40 with the piezoelectric actuator 41, with longitudinal grooves 51 on the outer telescoping tube 47 in the entire longitudinal expansion $L_2$; once again, corresponding longitudinal grooves can be provided on the inner telescoping tube 46, in the same way, with a length $L_3$. A combination of the transverse grooves 49 of FIG. 8 and the longitudinal grooves 51 of FIG. 11 is also possible, in a manner not shown here.

The foregoing relates to the preferred exemplary embodiments of the invention, it being understood that other variants and embodiments thereof are possible within the spirit and scope of the invention, the latter being defined by the appended claims.

The invention claimed is:

1. An actuator module having a piezoelectric actuator, comprising: elements disposed between an actuator head and an actuator foot; an elastomer layer surrounding at least the elements; and a fluid-tight sheath disposed over the elastomer layer and surrounded elements, the sheath, at least in some regions, having grooves formed by undulations, with which, by alignment of the grooves on a circumference of the sheath, radial and/or axial expansion motions of the piezoelectric actuator and/or of the elastomer layer can be absorbed, wherein the sheath is a telescoping sheath formed of telescoping tubes, movably guided longitudinally inside one another without rotating, of which at least one has the grooves, formed on its circumference in some regions by undulations, with which, by alignment of the grooves on the circumference of the sheath, radial and/or axial expansion motions of the piezoelectric actuator and/or of the elastomer layer can be absorbed, and longitudinal expansion between the two telescoping tubes of the telescoping sheath is possible.

2. The actuator module in accordance with claim 1, wherein the grooves are axially extending longitudinal grooves.

3. The actuator module in accordance with claim 1, wherein the grooves are radially extending transverse grooves.

4. The actuator module in accordance with claim 1, wherein the grooves are a combination of axially extending longitudinal grooves and radially extending transverse grooves.

5. The actuator module in accordance with claim 2, wherein the grooves are embodied as single- or multi-thread and clockwise and/or counterclockwise grooves extending at a predetermined angle to the longitudinal or transverse axis of the piezoelectric actuator.

6. The actuator module in accordance with claim 3, wherein the grooves are embodied as single- or multi-thread and clockwise and/or counterclockwise grooves extending at a predetermined angle to the longitudinal or transverse axis of the piezoelectric actuator.

7. The actuator module in accordance with claim 4, wherein the grooves are embodied as single- or multi-thread and clockwise and/or counterclockwise grooves extending at a predetermined angle to the longitudinal or transverse axis of the piezoelectric actuator.

8. The actuator module in accordance with claim 1, wherein the grooves are disposed in a middle region of the sheath.

9. The actuator module in accordance with claim 1, wherein the grooves are formed in regions on at least one lateral end in a longitudinal extent of the sheath.

10. The actuator module in accordance with claim 1, wherein the sheath is made from a metal, in particular from thin-walled steel.

11. The actuator module in accordance with claim 1, wherein the piezoelectric actuator is a component of a piezoelectric injector for an injection system for fuel in an internal combustion engine, in which the fuel bathes the sheath.

12. An actuator module having a piezoelectric actuator, comprising: elements disposed between an actuator head and an actuator foot; an elastomer layer surrounding at least the elements; and a fluid-tight sheath disposed over the elastomer layer and surrounded elements, the sheath, at least in some regions, having grooves formed by undulations, with which, by alignment of the grooves on a circumference of the sheath, radial and/or axial expansion motions of the piezoelectric actuator and/or of the elastomer layer can be absorbed, wherein the grooves are embodied by a combination of two different kinds of grooves having different orientations, with a first of the two different kinds of grooves disposed in a middle region of the sheath and with a second of the two different kinds of grooves disposed on both sides of the middle region.

13. The actuator module in accordance with claim 12, wherein the sheath is embodied by a corrugated bellows which has on its circumference the grooves formed in some regions by undulations, with which, by alignment of the grooves on the circumference of the sheath. radial and/or axial expansion motions of the piezoelectric actuator and/or of the elastomer layer can be absorbed.

14. The actuator module in accordance with claim 13, wherein a first kind of grooves are axially extending longitudinal grooves.

15. The actuator module in accordance with claim 14, wherein a second kind of grooves are radially extending transverse grooves.

16. The actuator module in accordance with claim 13, wherein the grooves are a combination of axially extending longitudinal grooves and radially extending transverse grooves.

17. The actuator module in accordance with claim 12, wherein the sheath is welded to the actuator head and/or to the actuator foot of the piezoelectric actuator.

18. An actuator module having a piezoelectric actuator, comprising: elements disposed between an actuator head and an actuator foot; an elastomer layer surrounding at least the elements; and a fluid-tight sheath disposed over the elastomer layer and surrounded elements, the sheath, at least in some regions has corrugated bellows having grooves formed by undulations, with which, by alignment of the grooves on a circumference of the sheath, radial and/or axial expansion motions of the piezoelectric actuator and/or of the elastomer layer can be absorbed, wherein different clockwise and counterclockwise helical circumferential grooves are disposed on the corrugated bellows which are disposed on both lateral regions of the sheath, the helical circumferential grooves having opposing pitch angles to a longitudinal axis of the piezoelectric actuator.

* * * * *